(12) United States Patent
Chien

(10) Patent No.: US 12,363,850 B2
(45) Date of Patent: Jul. 15, 2025

(54) TRAY WITH TRANSLATION FEATURES SUPPORTING ON-RACK SERVICE

(71) Applicant: Dell Products L.P., Round Rock, TX (US)

(72) Inventor: Tung-Yu Chien, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 151 days.

(21) Appl. No.: 18/170,708

(22) Filed: Feb. 17, 2023

(65) Prior Publication Data

US 2024/0284628 A1    Aug. 22, 2024

(51) Int. Cl.
  *H05K 7/14*    (2006.01)

(52) U.S. Cl.
  CPC .................................. *H05K 7/1489* (2013.01)

(58) Field of Classification Search
  CPC .................................................. A47B 88/427
  See application file for complete search history.

(56) References Cited

U.S. PATENT DOCUMENTS

| | | | | |
|---|---|---|---|---|
| 5,378,057 A | * | 1/1995 | Bach | A47B 55/00 312/334.4 |
| 5,632,542 A | * | 5/1997 | Krivec | A47B 88/427 403/294 |
| 5,927,838 A | * | 7/1999 | Hellman, Jr. | F16B 12/38 312/263 |
| 5,927,839 A | * | 7/1999 | Alfaro | A47B 88/994 312/301 |
| 6,076,908 A | * | 6/2000 | Maffeo | A47B 88/427 248/222.51 |
| 7,604,307 B2 | * | 10/2009 | Greenwald | A47B 88/49 312/334.46 |
| 7,823,994 B2 | * | 11/2010 | Yang | H05K 7/1489 312/334.46 |
| 8,403,433 B2 | * | 3/2013 | Chen | A47B 88/427 312/333 |
| 8,870,310 B2 | * | 10/2014 | Kuba | A47B 88/437 312/334.41 |
| 9,504,323 B1 | * | 11/2016 | Porreca | A47B 88/407 |
| 9,681,574 B1 | * | 6/2017 | Chen | H05K 7/1489 |
| 10,117,352 B2 | * | 10/2018 | Chen | A47B 88/43 |
| 10,154,731 B2 | * | 12/2018 | Chen | A47B 88/487 |
| 10,213,017 B2 | * | 2/2019 | Chen | F16C 29/04 |
| 11,839,300 B1 | * | 12/2023 | Li | A47B 88/43 |

(Continued)

*Primary Examiner* — Hanh V Tran
(74) *Attorney, Agent, or Firm* — Jackson Walker L.L.P.

(57) ABSTRACT

A chassis for housing a modular information handling system may include a wall, a plurality of rollers, and a translating bracket mechanically coupled to the rollers and configured to engage with the plurality of rollers to enable linear translation of the translating bracket relative to the wall, the translating bracket comprising, extending from the translating bracket in a direction generally perpendicular to the wall, one or more first alignment features, each of the one or more first alignment features configured to mechanically engage with a corresponding one of one or more second alignment features formed on a tray, such that the mechanical engagement between the one or more first alignment features and the one or more second alignment feature provides a desired alignment of the tray with the translating bracket for assembly of the tray to the translating bracket.

11 Claims, 15 Drawing Sheets

(56) References Cited

U.S. PATENT DOCUMENTS

| | | | |
|---|---|---|---|
| 2003/0111941 A1* | 6/2003 | Noel | A47B 91/005 |
| | | | 312/334.4 |
| 2007/0164642 A1* | 7/2007 | Youngs | E05B 65/466 |
| | | | 312/221 |
| 2010/0226083 A1* | 9/2010 | Wang | H05K 7/1489 |
| | | | 361/679.02 |
| 2011/0080081 A1* | 4/2011 | Klausing | A47B 88/427 |
| | | | 312/333 |

* cited by examiner

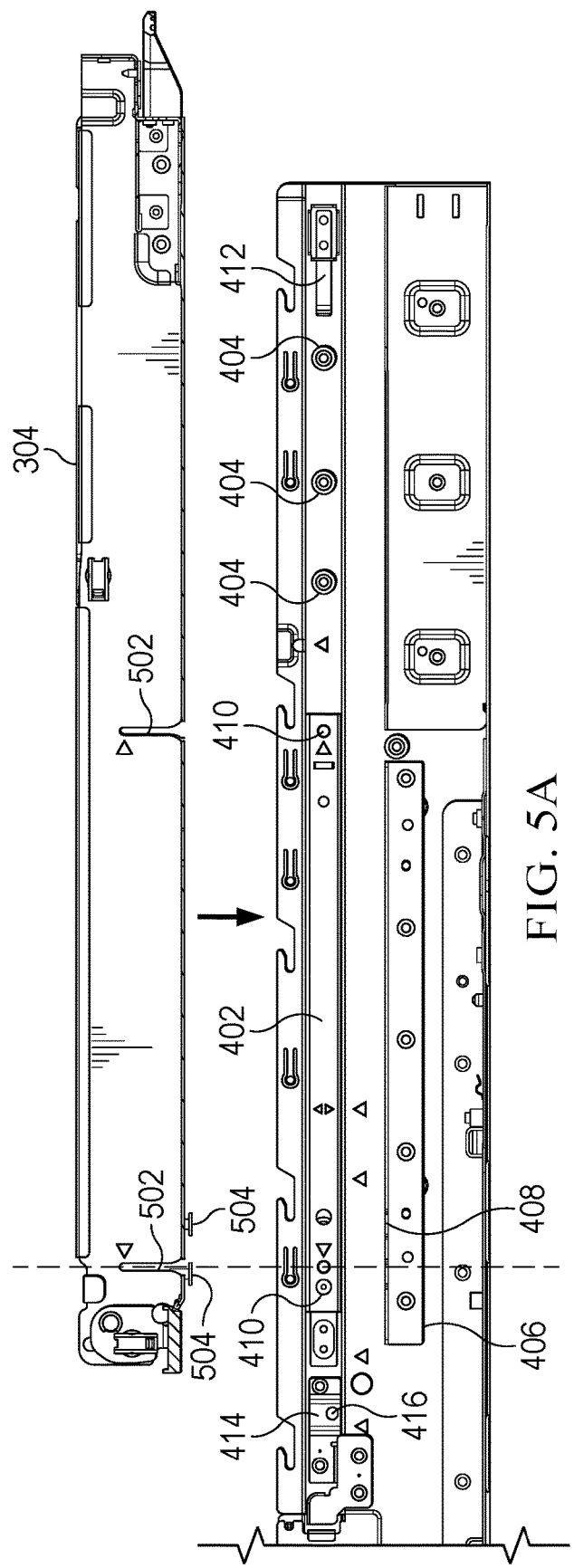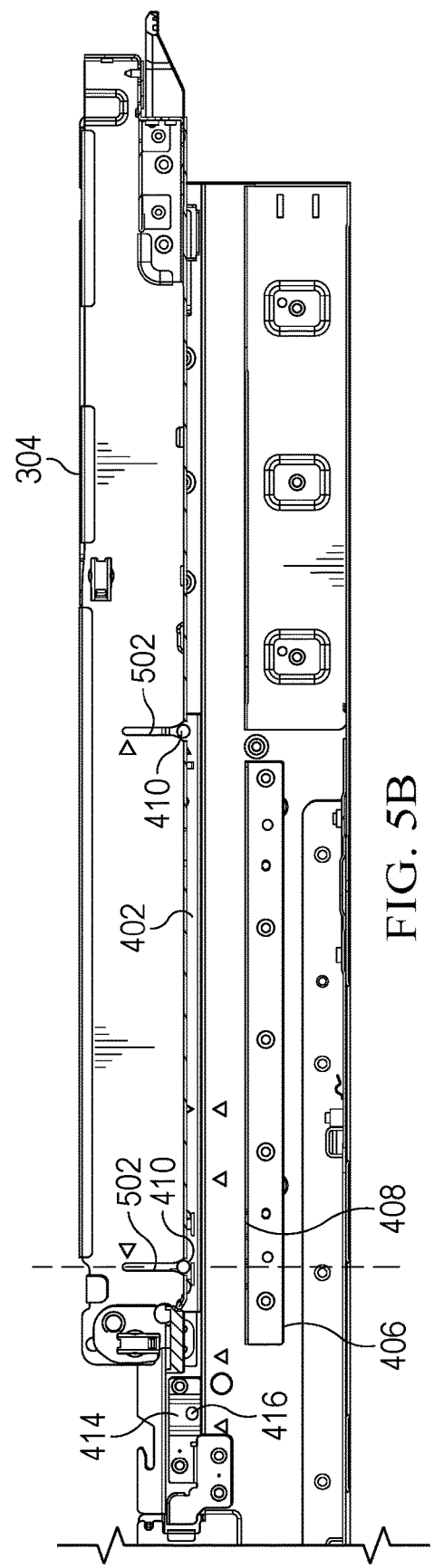
FIG. 5A
FIG. 5B

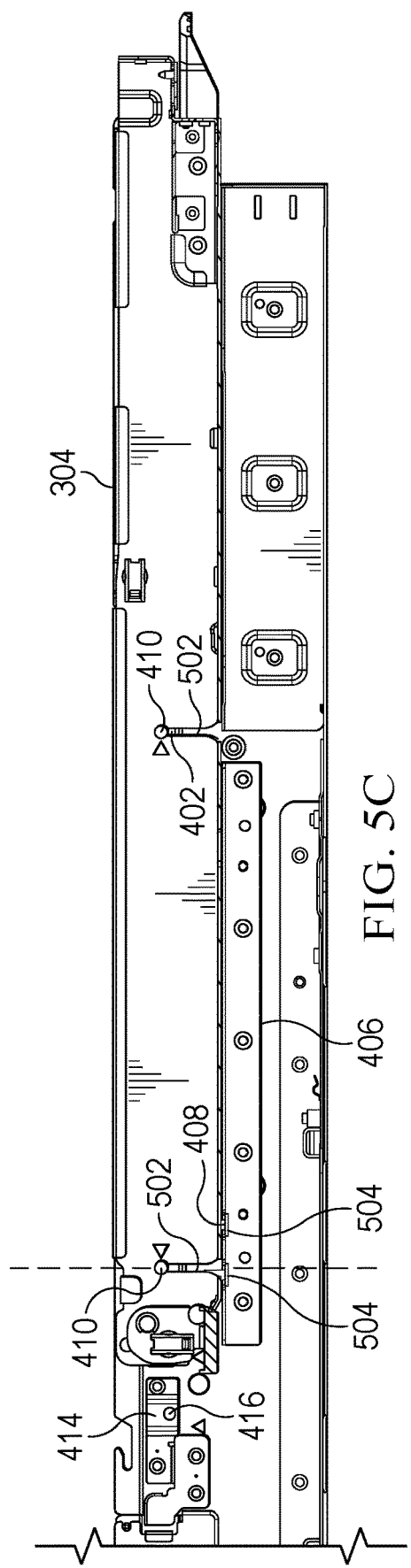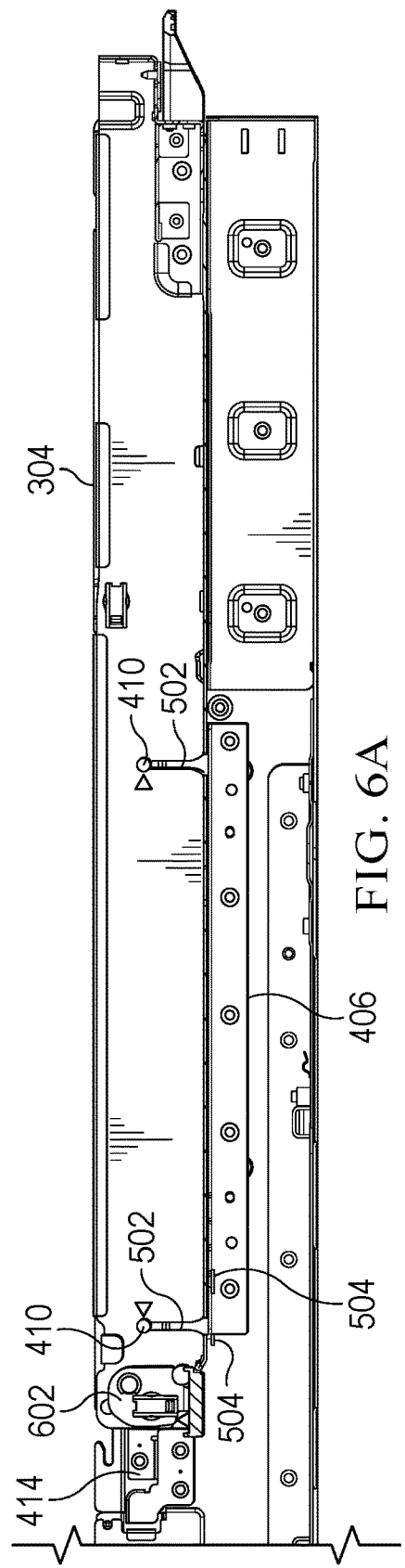

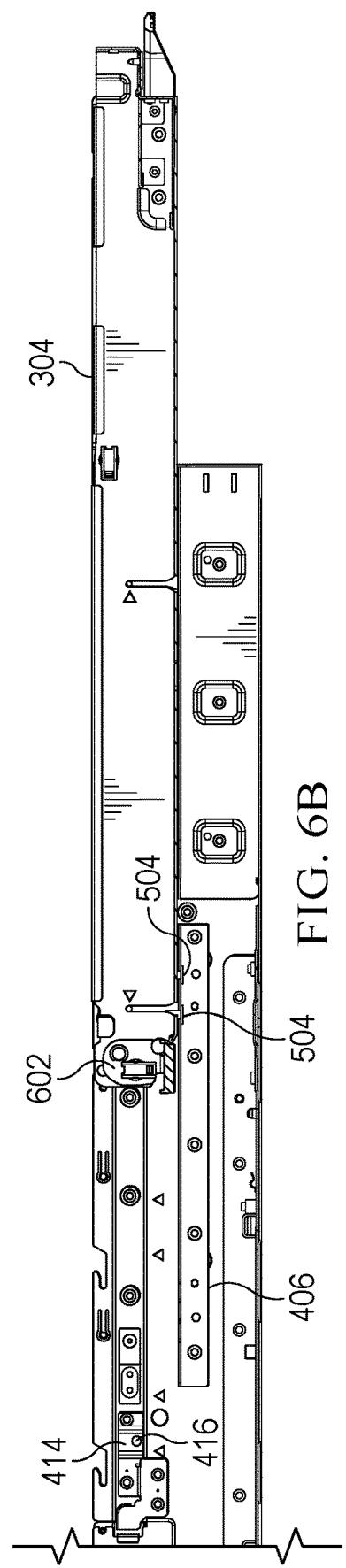

TRAY WITH TRANSLATION FEATURES SUPPORTING ON-RACK SERVICE

TECHNICAL FIELD

The present disclosure relates to modular information handling systems. More specifically, embodiments of the disclosure provide systems and methods for implementing a tray with mechanical translation features which supports on-rack servicing of a modular information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems are manufactured in a modular form factor and may be configured to be disposed in a chassis configured to receive such modular components. Such a chassis and its component modular information handling systems and information handling resources typically include various rails, carriers, and other mechanical components allowing for a person to add and remove the modular information handling systems from the chassis for servicing, repair, or replacement.

In the industry, modular information handling systems are often classified by height in terms of a number of "rack units" with each rack unit or "U" being about 1.75 inches in height. Thus, modular information handling systems may come in heights which are multiples of a rack unit, with such height stated as an integer number followed by "U." Thus, a server/modular information handling system may be identified as being a "1U server," "2U server," "4U server," etc.

In a typical 2U server form factor, storage devices and a main motherboard may be located within the upper rack unit of the server with other modules (e.g., power supply units, power distribution board, graphics or other accelerators, direct liquid cooling equipment, or other components) located in the lower rack unit of the 2U server. One disadvantage of such form factor is that components in the lower rack unit of the 2U server may be difficult to service as it may require removal of components located in the upper rack unit. Further, with densities of components placed within a modern server, there is often limited space available to provide mechanical mechanisms to aid in serviceability.

SUMMARY

In accordance with the teachings of the present disclosure, the disadvantages and problems associated with existing approaches to servicing information handling resources may be reduced or eliminated.

In accordance with embodiments of the present disclosure, a chassis for housing a modular information handling system may include a wall, a plurality of rollers, and a translating bracket mechanically coupled to the rollers and configured to engage with the plurality of rollers to enable linear translation of the translating bracket relative to the wall, the translating bracket comprising, extending from the translating bracket in a direction generally perpendicular to the wall, one or more first alignment features, each of the one or more first alignment features configured to mechanically engage with a corresponding one of one or more second alignment features formed on a tray, such that the mechanical engagement between the one or more first alignment features and the one or more second alignment feature provides a desired alignment of the tray with the translating bracket for assembly of the tray to the translating bracket.

In accordance with these and other embodiments of the present disclosure, a system may include a tray configured to house one or more information handling resources and a chassis comprising a wall, a plurality of rollers, and a translating bracket mechanically coupled to the rollers and configured to engage with the plurality of rollers to enable linear translation of the translating bracket relative to the wall, the translating bracket comprising, extending from the translating bracket in a direction generally perpendicular to the wall, one or more first alignment features, each of the one or more first alignment features configured to mechanically engage with a corresponding one of one or more second alignment features formed on the tray, such that the mechanical engagement between the one or more first alignment features and the one or more second alignment feature provides a desired alignment of the tray with the translating bracket for assembly of the tray to the translating bracket.

In accordance with these and other embodiments of the present disclosure, a tray for housing one or more information handling resources may include a housing and one or more first alignment features formed in the housing and configured to mechanically engage with a corresponding one of one or more second alignment features formed on a translating bracket configured to linearly translate relative to a chassis wall, such that the mechanical engagement between the one or more first alignment features and the one or more second alignment feature provides a desired alignment of the tray with the translating bracket for assembly of the tray to the translating bracket.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIGS. 5A-5C illustrate a side elevation view of selected components of a planar tray and a housing of the information handling system depicted in FIG. 2, depicting the assembly of the planar tray to a translating bracket and constraint bracket, in accordance with embodiments of the present disclosure;

FIGS. 6A and 6B illustrate a side elevation view of selected components of a planar tray and a housing of the information handling system depicted in FIG. 2, depicting linear translation of the planar tray relative to the housing, in accordance with embodiments of the present disclosure;

DETAILED DESCRIPTION

Preferred embodiments and their advantages are best understood by reference to FIGS. 1 through 11, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

Figure 1:
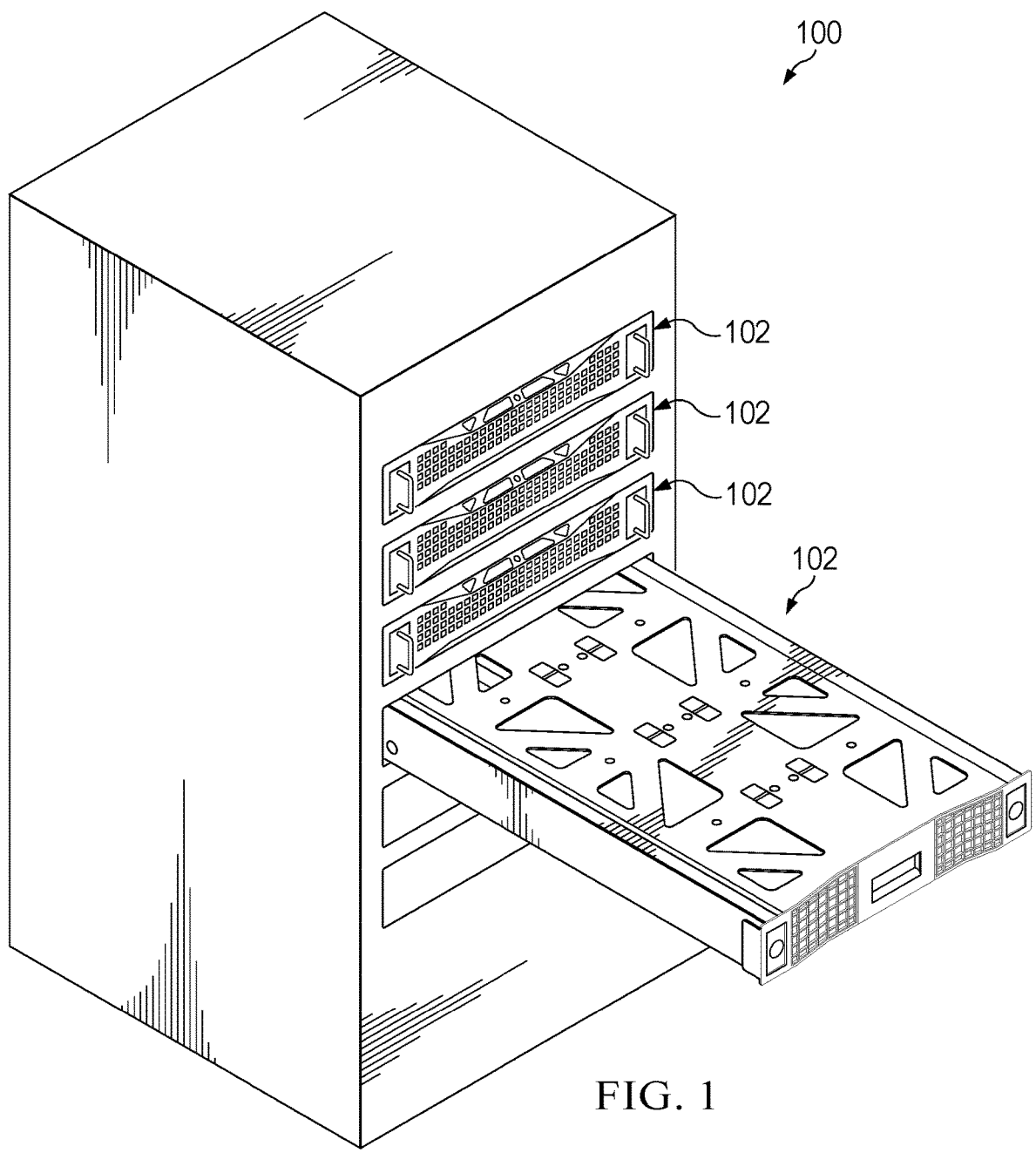
FIG. 1 illustrates a perspective view of selected components of a chassis for receiving modular information handling resources, in accordance with embodiments of the present disclosure.

FIG. 1 illustrates a perspective view of selected components of a chassis 100 for receiving modular information handling resources, in accordance with embodiments of the present disclosure. Chassis 100 may be an enclosure that serves as a container for various information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 100 may be configured to hold and/or provide power to a plurality of information handling systems and/or information handling resources. As depicted in FIG. 1, chassis 100 may include modular information handling systems 102.

Figure 2:
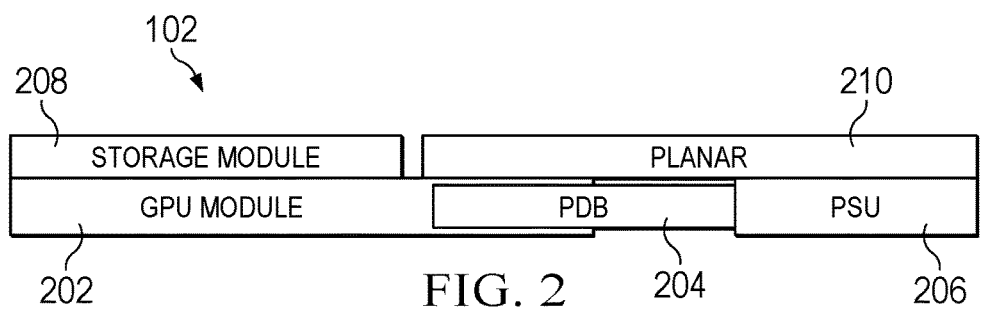
FIG. 2 illustrates a side elevation view of selected components of an example modular information handling system, in accordance with embodiments of the present disclosure.

FIG. 2 illustrates a side elevation view of selected components of an example modular information handling system 102, in accordance with embodiments of the present disclosure. As shown in FIG. 2, information handling system 102 may be implemented as a 2U server, with its lower rack unit housing components including a graphics processor unit (GPU) module 202, power distribution board (PDB) 204, and power supply unit (PSU) 206. The upper rack unit of information handling system 102 may include a storage module 208 comprising one or more storage resources and a planar module 210 comprising a system main motherboard and associated components.

Figure 3A:
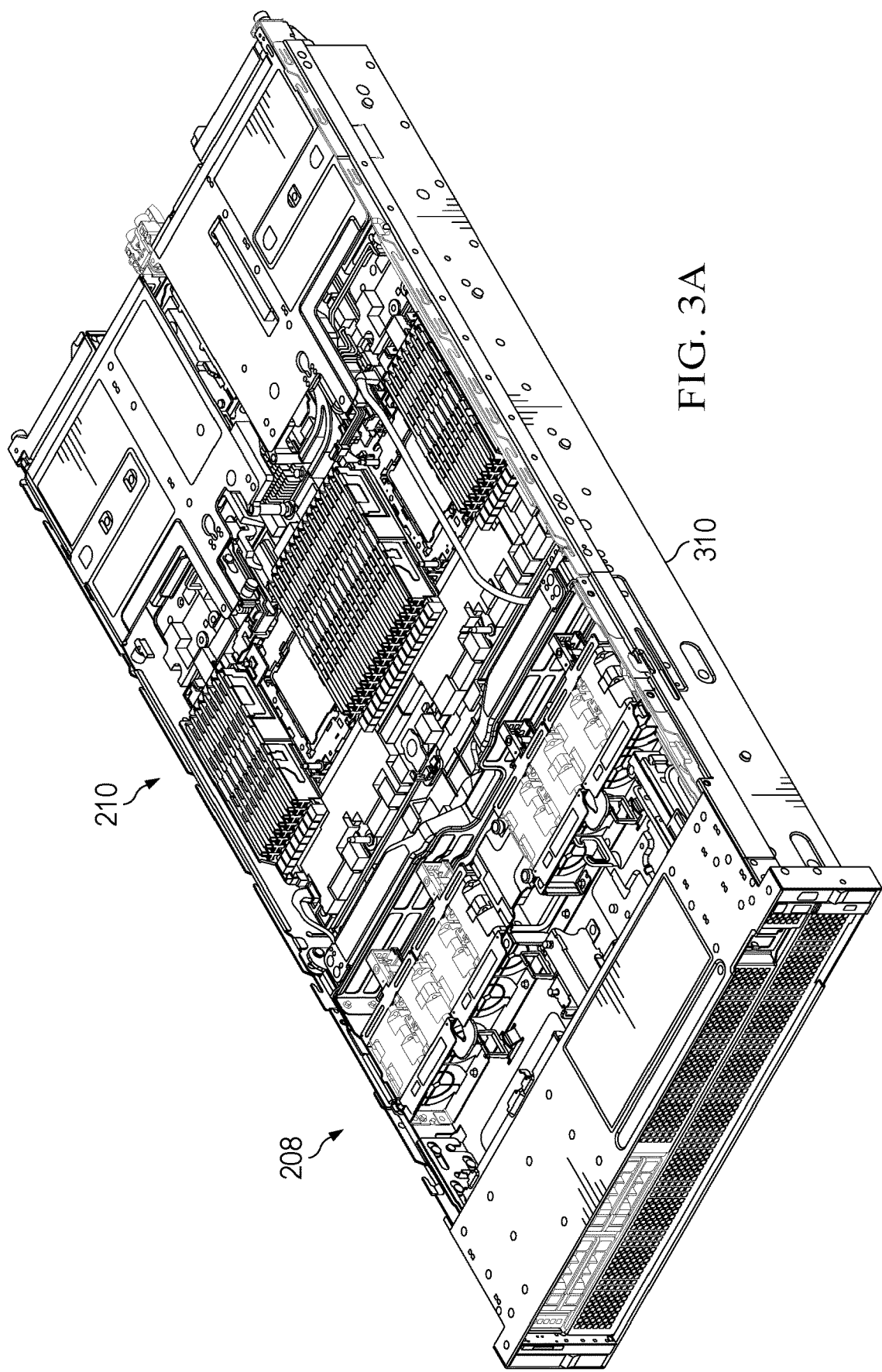
FIG. 3A illustrates a perspective view of selected components of the modular information handling system depicted in FIG. 2, in accordance with embodiments of the present disclosure.
Figure 3B:
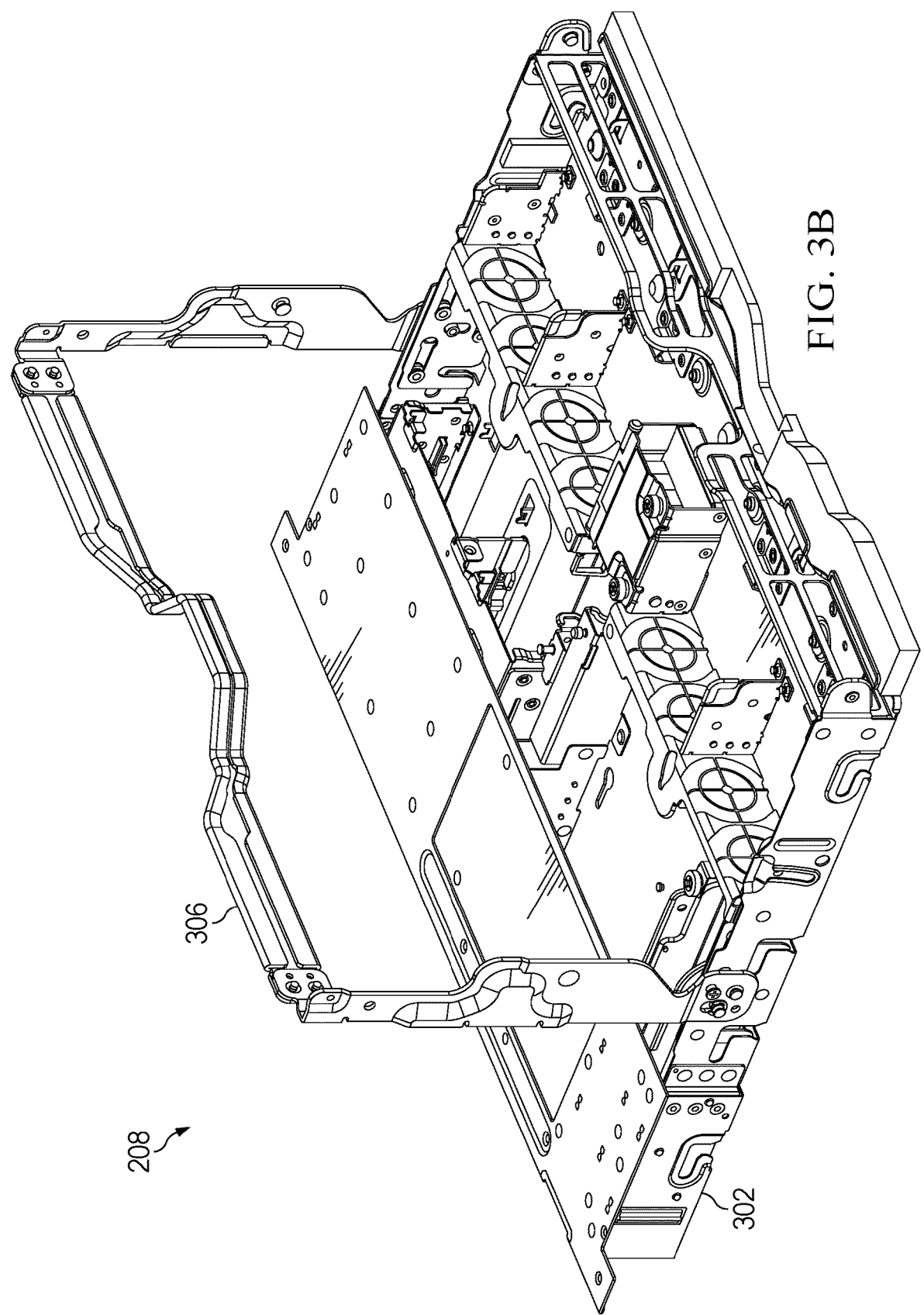
FIG. 3B illustrates a perspective view of selected components of a storage module of the modular information handling system depicted in FIG. 2, in accordance with embodiments of the present disclosure.
Figure 3C:
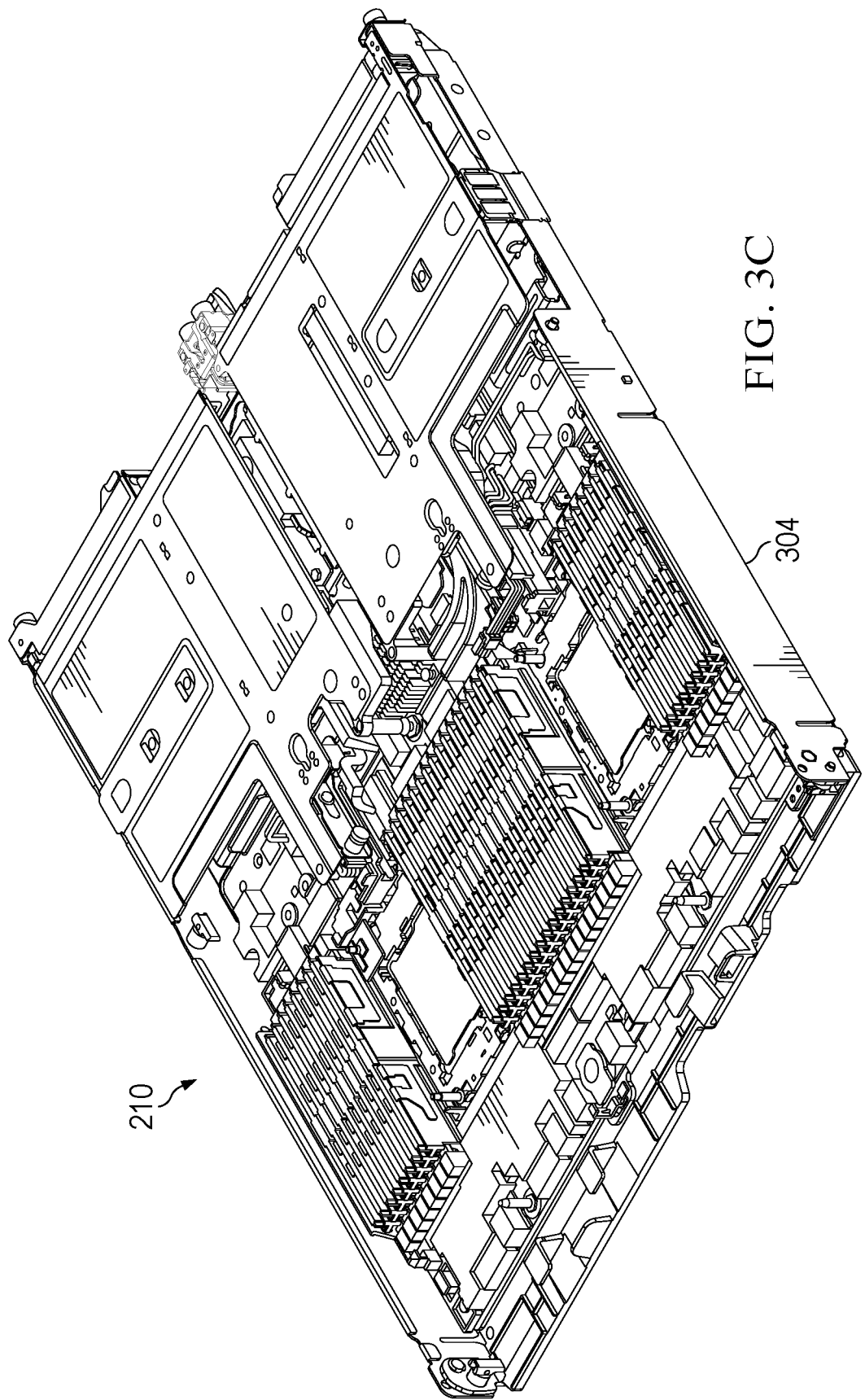
FIG. 3C illustrates a perspective view of selected components of a planar module of the modular information handling system depicted in FIG. 2, in accordance with embodiments of the present disclosure.

FIG. 3A illustrates a perspective view of selected components of modular information handling system 102, in accordance with embodiments of the present disclosure. As shown in FIG. 3B, storage module 208 may be implemented with a basket 302 that may house components of storage module 208 and which may be lifted (e.g., via use of a handle 306) from a housing 310 for housing the various components of information handling system 102. Further as shown in FIG. 3C, planar module 210 may be implemented with a planar tray 304 that may house components of planar module 210, wherein planar tray 304 may be mechanically translatable relative to housing 310 as described in greater detail below.

Figure 4:
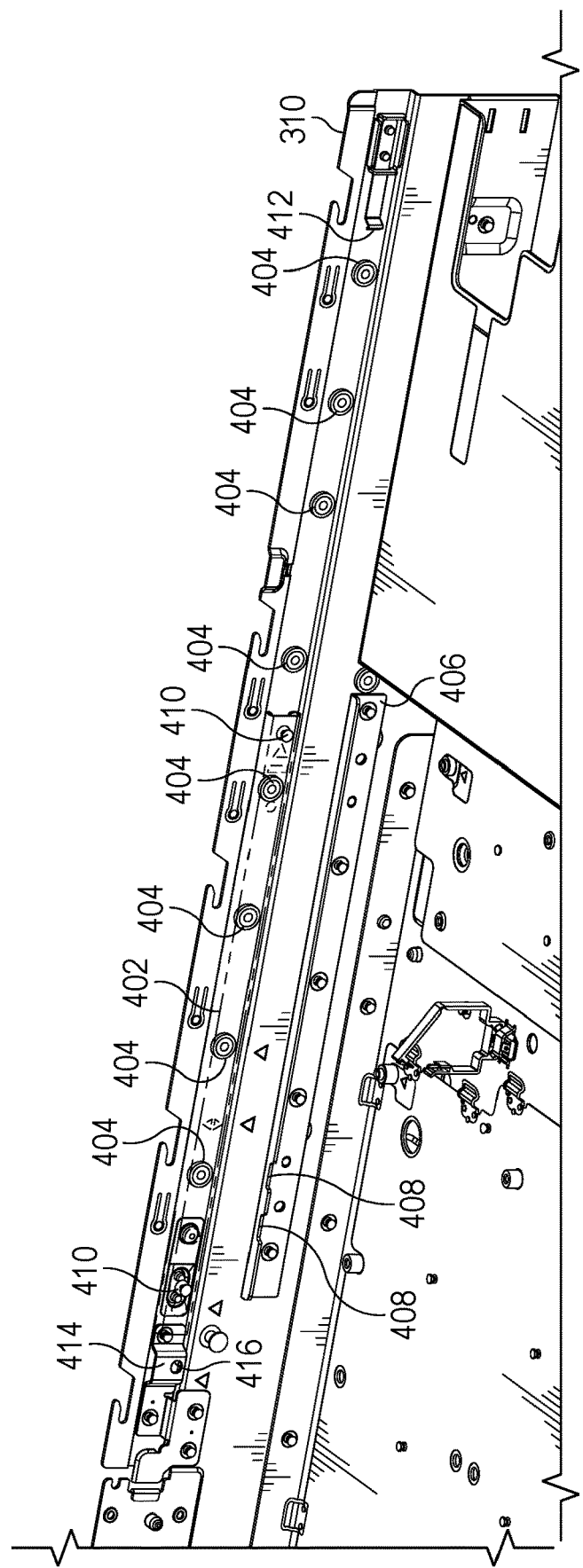
FIG. 4 illustrates a perspective view of selected components of a housing of the information handling system depicted in FIG. 2, in accordance with embodiments of the present disclosure.

FIG. 4 illustrates a perspective view of selected components of housing 310, in accordance with embodiments of the present disclosure. As shown in FIG. 4, a translating bracket 402 may be mechanically coupled to housing 310 via a plurality of rollers 404. Translating bracket 402 may be configured (e.g., sized and shaped) relative to rollers 404 such that rollers 404 maintain and constrain translating bracket 402 to a linear motion relative to housing 310.

As also shown in FIG. 4, a constraint bracket 406 may be fixedly coupled relative to housing 310, and may have one or more slots 408 formed along a top edge thereof configured to receive retention features of planar tray 304, as described in greater detail below.

As further shown in FIG. 4, translating bracket 402 may include one or more tray alignment features 410 extending from and mechanically coupled to a surface of translating bracket 402. Tray alignment features 410 may be implemented in any suitable manner, including as T-shaped standoffs as shown in FIG. 4. As described in greater detail below, tray alignment features 410 may be configured to mechanically engage with corresponding tray alignment features of planar tray 304 in order to mechanically align planar tray 304 at a desired position relative to translating bracket 402, as described in greater detail below.

As additionally shown in FIG. 4, housing 310 may have fixedly coupled thereto a rear stop feature 412 and a front stop feature 414. Rear stop feature 412 and front stop feature 414 may be configured to, as described in greater detail below, mechanically interact with translating bracket 402 to constrain the linear motion of translating bracket 402 relative to housing 310. Further as shown in FIG. 4, front stop feature 414 may include a plunger lock hole 416 configured to mechanically engage with a plunger lock of planar tray 304, in order to, when planar tray 304 together with translating bracket 402 are translated proximate to the front stop feature 414, mechanically maintain planar tray 304 and translating bracket 402 in position and prevent linear motion of translating bracket 402 relative to housing 310.

For purposes of clarity and exposition, FIG. 4 depicts the selected components coupled to housing 310 only on one side of housing 310. However, it is understood that some or all of the features shown in FIG. 4 may be duplicated on a side of housing 310 opposite to that depicted in FIG. 4, in order to further facilitate translation of planar tray 304 together with translating bracket 402 relative to housing 310.

FIGS. 5A-5C illustrate a side elevation view of selected components of planar tray 304 and housing 310, depicting the assembly of planar tray 304 to translating bracket 402 and constraint bracket 406, in accordance with embodiments of the present disclosure. Starting as shown in FIG. 5A, in order to assemble planar tray 304 to translating bracket 402 and constraint bracket 406, one or more tray alignment features 502 of planar tray 304 (e.g., which may be implemented as elongated slots formed in the sides of planar tray 304) may be aligned with corresponding tray alignment features 410 and planar tray 304 may be lowered down into housing 310 as shown in FIG. 5B, with the mechanical engagement of tray alignment features 502 and tray alignment features 410 guiding the downward lowering of planar tray 304 into housing 310 until such time as each tray alignment feature 410 engages with a terminus of its corresponding tray alignment feature 502 as shown in FIG. 5C. Notably, as planar tray 304 is assembled to translating bracket 402 as shown in FIGS. 5A-5C, one or more retention features 504 of planar tray 304 may each pass through a corresponding slot 408 of constraint bracket 406. Retention features 504 may be implemented in any suitable manner, including as T-shaped standoffs as shown in FIGS. 5A-5C.

Once assembled as shown in FIG. 5C, planar tray 304, now coupled in a fixed manner to translating bracket 402, may be moved in a linear direction relative to housing 310 between a front position as shown in FIG. 6A to a rear position as shown in FIG. 6B and vice versa. In the front position, planar tray 304 may also be said to be in its "normal" position, wherein planar tray 304 is substantially within the footprint of housing 310, while in the rear position, planar tray 304 may be said to be in its "servicing" position, in which a substantial portion of planar tray 304 is outside the footprint of housing 310, thus allowing a technician or user access to the lower rack unit of information handling system 102.

Figure 7:
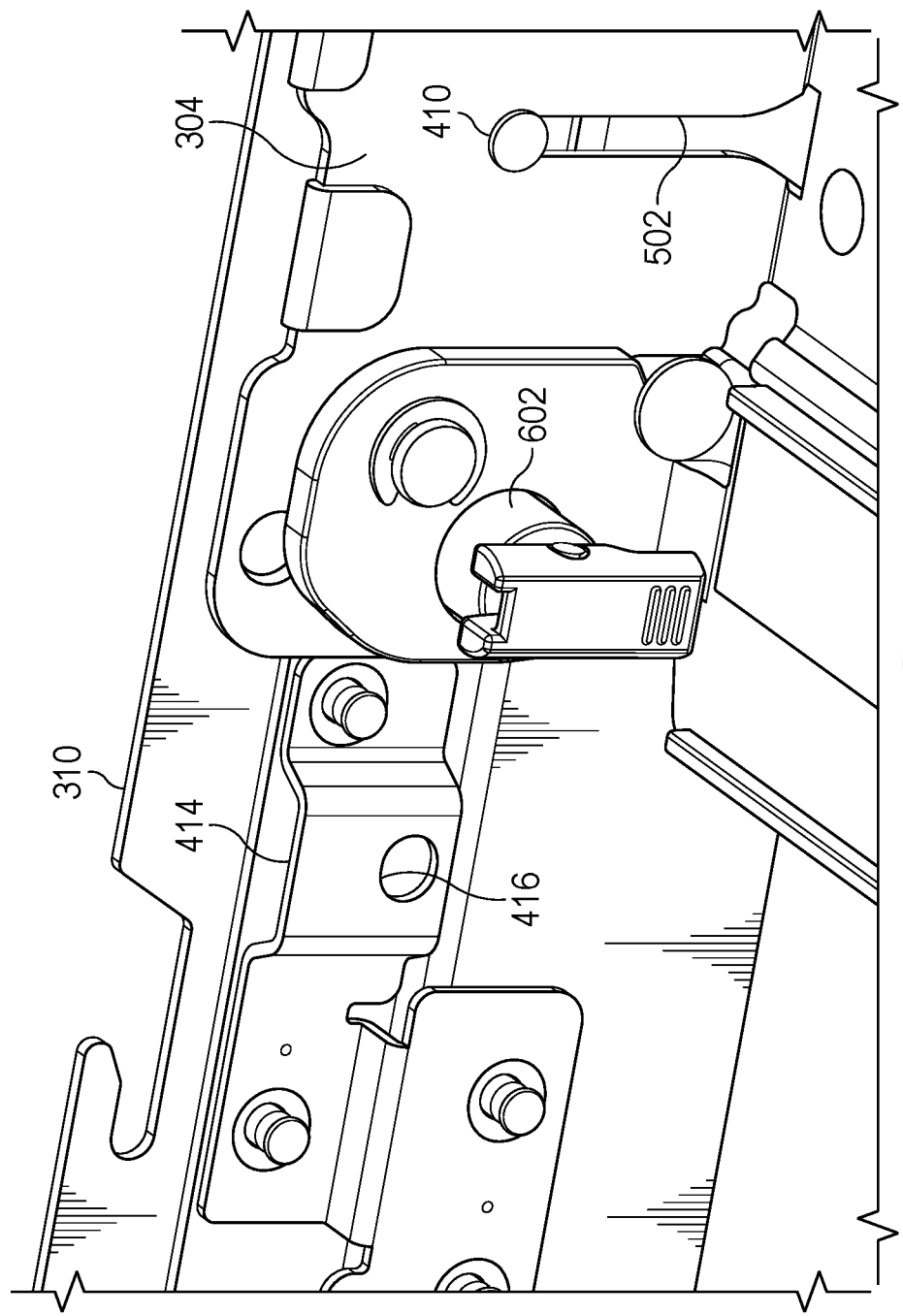
FIG. 7 illustrates a detailed perspective view of a plunger lock and a plunger lock hole, in accordance with embodiments of the present disclosure.

As also shown in FIG. 6A, when in the front position, a plunger lock 602 mechanically coupled to planar tray 304 may mechanically engage with plunger lock hole 416, retaining planar tray 304 and translating bracket 402 in the front position until such time a user or technician interacts with plunger lock 602 to disengage plunger lock 602 from plunger lock hole 416. Further detail of plunger lock 602 and plunger lock hole 416 are shown in FIG. 7.

Figure 8A:
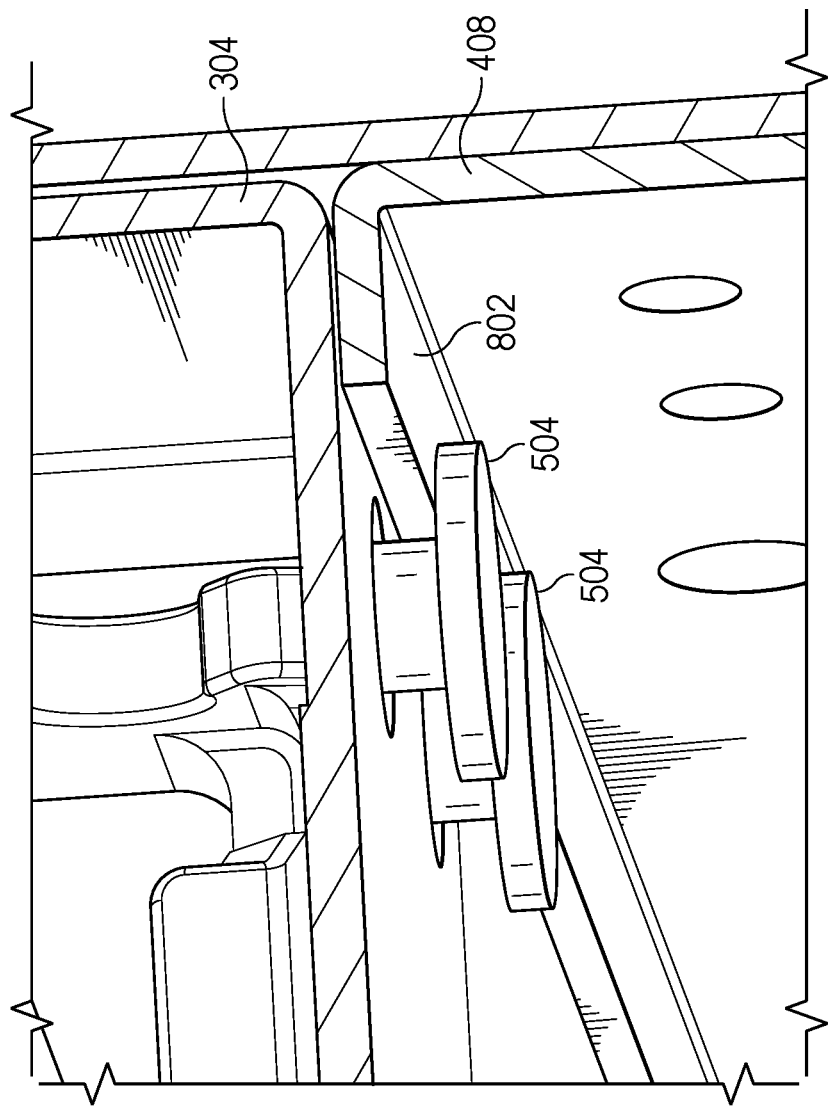
FIG. 8A illustrates a detailed perspective view of retention features of a planar tray mechanically interacting with a constraint bracket, in accordance with embodiments of the present disclosure.
Figure 8B:
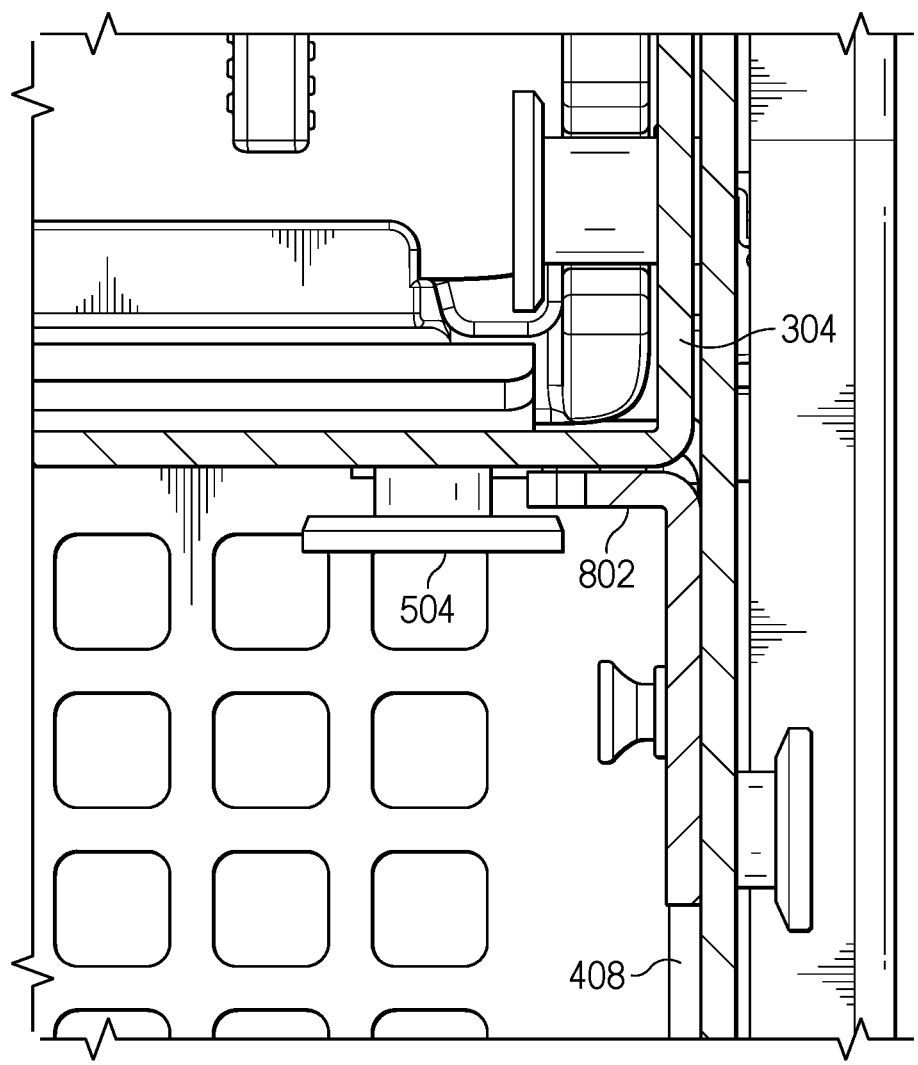
FIG. 8B illustrates a detailed side elevation view of retention features of a planar tray mechanically interacting with a constraint bracket, in accordance with embodiments of the present disclosure.

As mentioned above, during assembly of planar tray 304 to translating bracket 402 (e.g., as shown in FIGS. 5A-5C), one or more retention features 504 of planar tray 304 may each pass through a corresponding slot 408 of constraint bracket 406. After assembly, as shown in FIGS. 8A and 8B, retention features 504 may engage with a retention edge 802 of constraint bracket 406, wherein retention edge 802 is substantially perpendicular to a side of housing 310 to which constraint bracket 406 is coupled. Accordingly, the mechanical interaction of constraint bracket 406 to retention features 504 may further constrain the translation of planar tray 304 to housing 310 in a linear direction, and prevent planar tray 304 from being unseated from translating bracket 402, i.e., prevented from being moved upward relative to housing 310 from the perspective shown in FIGS. 6A and 6B. Thus, in order to disassemble planar tray 304 from translating bracket 402, a technician or user may need to realign retention features 504 of planar tray 304 to their corresponding slots 408 of constraint bracket 406.

Figure 9A:
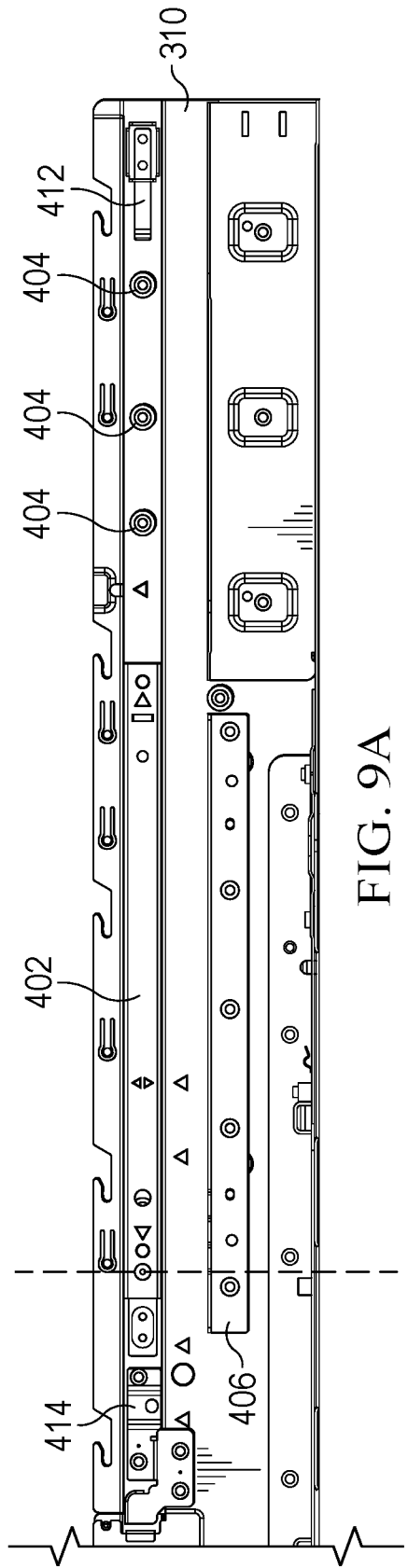
FIGS. 9A-9C illustrate a side elevation view of selected components of a housing of the information handling system depicted in FIG. 2 during linear translation of a translating bracket relative to the housing, in accordance with embodiments of the present disclosure.
Figure 9B:
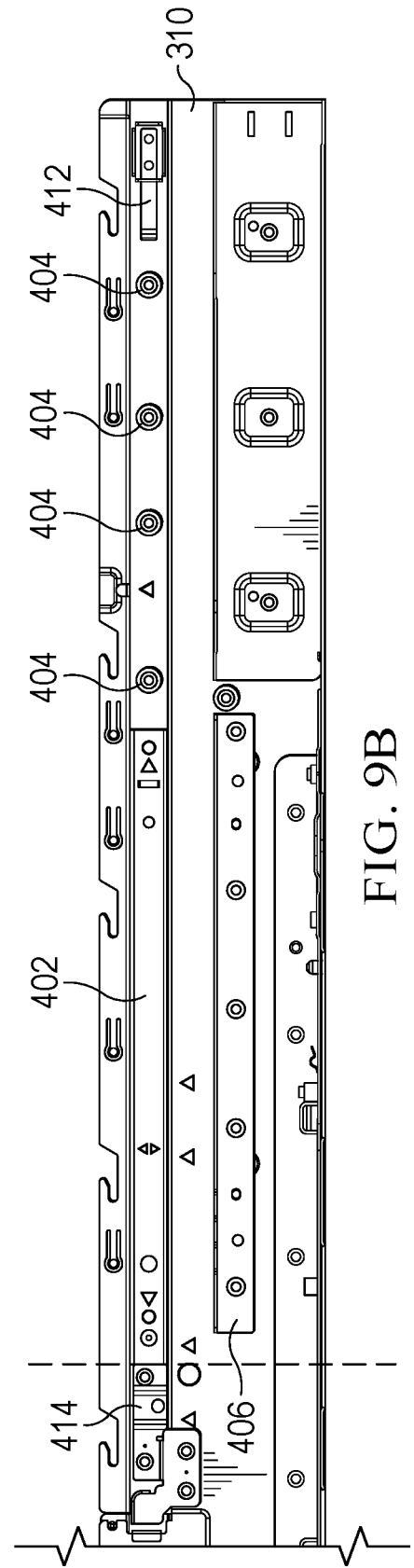
Figure 9C:
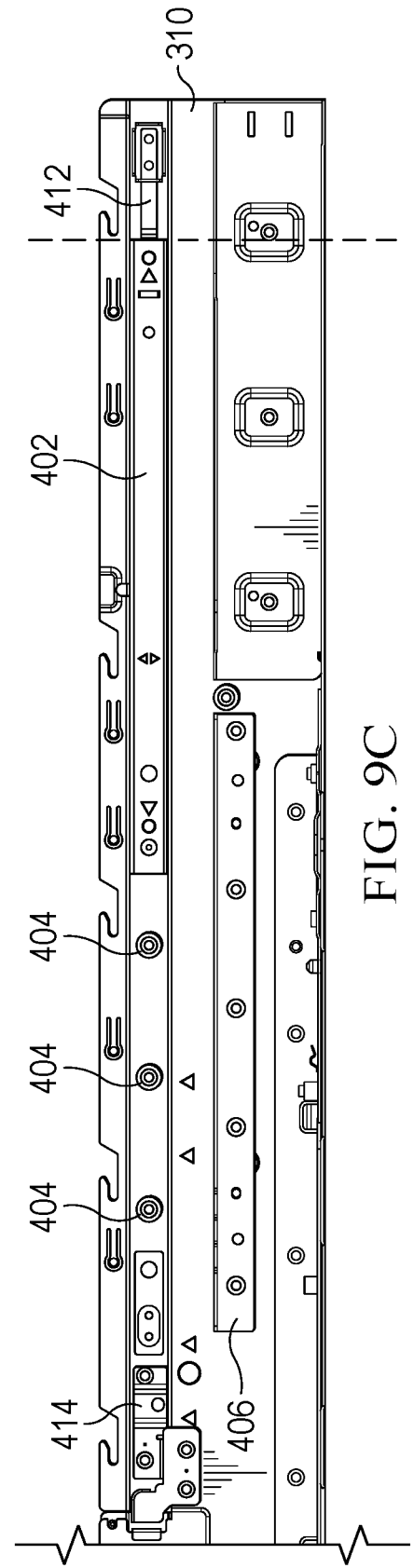

FIGS. 9A-9C illustrate a side elevation view of selected components of housing 310 during linear translation of translating bracket 402 relative to housing 310, in accordance with embodiments of the present disclosure. Thus, for purposes of clarity and exposition, planar tray 304 is not shown in FIGS. 9A-9C. In particular: (a) FIG. 9A depicts a position of translating bracket 402 relative to housing 310 at the point in which planar tray 304 is assembled to translating bracket (e.g., the same position as shown in FIG. 5C); (b) FIG. 9B depicts translating bracket 402 relative to housing 310 at the front position shown in FIG. 6A such that translating bracket 402 mechanically interacts with and is constrained by front stop feature 414; and (c) FIG. 9C depicts translating bracket 402 relative to housing 310 at the rear position shown in FIG. 6B such that translating bracket 402 mechanically interacts with and is constrained by rear stop feature 412.

Figure 10:
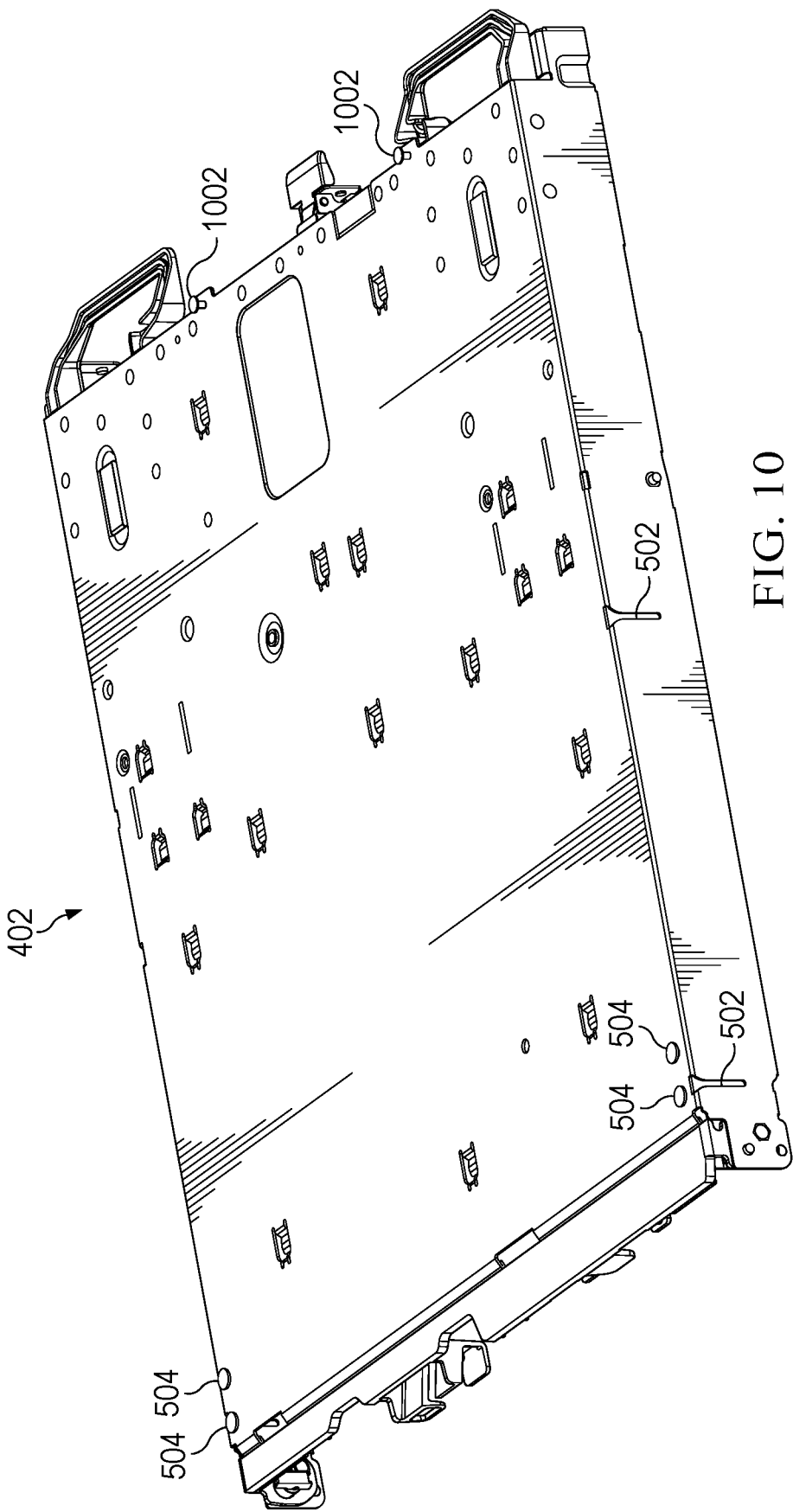
FIG. 10 illustrates a perspective view of a bottom of a planar tray, in accordance with embodiments of the present disclosure.
Figure 11:
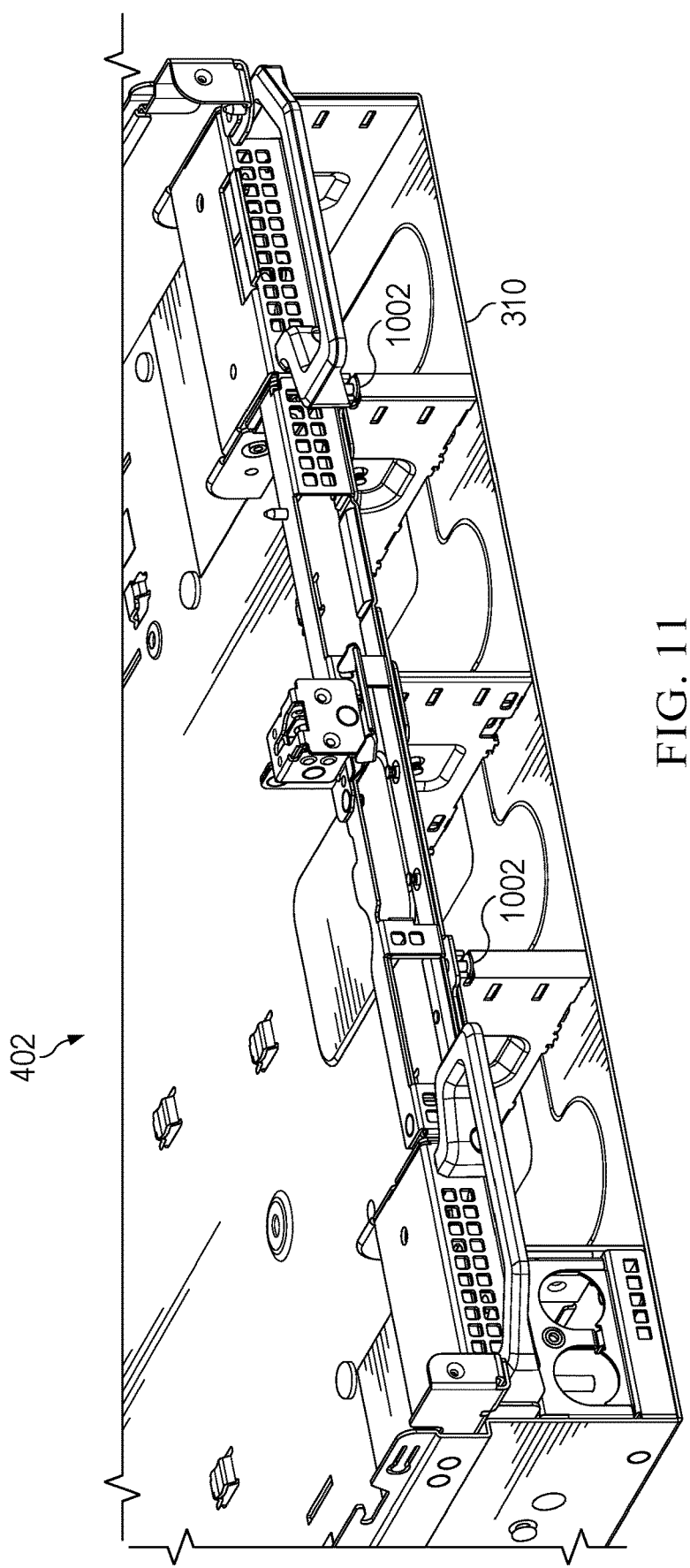
FIG. 11 illustrates a perspective view of selected components of a modular information handling system, in accordance with embodiments of the present disclosure.

In addition to the various features shown above, planar tray 304 may also have located on its bottom side and extending from such bottom side, one or more retention features 1002, as shown in FIG. 10. Retention features 1002 may be implemented in any suitable manner, including as T-shaped standoffs as shown in FIG. 10. As shown in FIG. 11, such one or more retention features 1002 may mechanically engage with corresponding features of housing 310 (e.g., features formed in walls separating bays of the lower rack unit of information handling system 102) to provide further retention, alignment, and/or constraint of planar tray 304 relative to housing 310 when planar tray 304 is in the front position.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. S 112 (f) unless the words "means for" or "step for" are explicitly used in the particular claim.

What is claimed is:

1. A chassis for housing a modular information handling system, the chassis comprising:
    a wall;
    a plurality of rollers;
    a translating bracket mechanically coupled to the rollers and configured to engage with the plurality of rollers to enable linear translation of the translating bracket relative to the wall, the translating bracket comprising, extending from the translating bracket in a direction generally perpendicular to the wall, one or more first alignment features, each of the one or more first alignment features configured to mechanically engage with a corresponding one of one or more second alignment features each formed as a slot within a tray, such that the mechanical engagement between the one or more first alignment features and the one or more second alignment features provides a desired alignment of the tray with the translating bracket for assembly of the tray to the translating bracket; and
    a constraint bracket directly coupled to the wall, wherein the constraint bracket comprises:
        a slot configured such that a corresponding retention feature formed on the tray is able to pass through the slot at the desired alignment during assembly of the tray to the translating bracket; and
        a retention edge extending substantially perpendicularly from the wall and configured to mechanically engage with the corresponding retention feature after assembly of the tray to the translating bracket to retain assembly of the tray to the translating bracket.

2. The chassis of claim 1, further comprising a mechanical stop coupled to the wall and configured to limit linear translation of the translating bracket relative to the wall.

3. The chassis of claim 2, the mechanical stop comprising a plunger lock hole configured to mechanically engage with a plunger lock mechanically coupled to the tray in order to retain the tray in a position relative to the translating bracket.

4. The chassis of claim 1, further comprising a retaining feature configured to mechanically engage with a retention feature formed on a bottom surface of the tray and extending substantially perpendicular from the tray.

5. A system comprising:
    a tray configured to house one or more information handling resources; and
    a chassis comprising:
        a wall;
        a plurality of rollers;
        a translating bracket mechanically coupled to the rollers and configured to engage with the plurality of rollers to enable linear translation of the translating bracket relative to the wall, the translating bracket comprising, extending from the translating bracket in a direction generally perpendicular to the wall, one or more first alignment features, each of the one or more first alignment features configured to mechanically engage with a corresponding one of one or more second alignment features formed each formed as a slot within the tray, such that the mechanical engagement between the one or more first alignment features and the one or more second alignment features provides a desired alignment of the tray with the translating bracket for assembly of the tray to the translating bracket; and a constraint bracket directly coupled to the wall, wherein the constraint bracket comprises:

a slot configured such that a corresponding retention feature formed on the tray is able to pass through the slot at the desired alignment during assembly of the tray to the translating bracket; and a retention edge extending substantially perpendicularly from the wall and configured to mechanically engage with the corresponding retention feature after assembly of the tray to the translating bracket to retain assembly of the tray to the translating bracket.

6. The system of claim 5, the chassis further comprising a mechanical stop coupled to the wall and configured to limit linear translation of the translating bracket relative to the wall.

7. The system of claim 6, the mechanical stop comprising a plunger lock hole configured to mechanically engage with a plunger lock mechanically coupled to the tray in order to retain the tray in a position relative to the translating bracket.

8. The system of claim 5, the chassis further comprising a retaining feature configured to mechanically engage with a retention feature formed on a bottom surface of the tray and extending substantially perpendicular from the tray.

9. A tray for housing one or more information handling resources, the tray comprising:

a housing;

one or more first alignment features each formed as a slot within the housing and configured to mechanically engage with a corresponding one of one or more second alignment features formed on a translating bracket configured to linearly translate relative to a chassis wall, such that the mechanical engagement between the one or more first alignment features and the one or more second alignment features provides a desired alignment of the tray with the translating bracket for assembly of the tray to the translating bracket; and a retention feature coupled to and extending substantially perpendicularly from a bottom surface of the housing and configured to:

pass through a corresponding slot of a constraint bracket directly coupled to the chassis wall during assembly of the tray to the translating bracket; and mechanically engage with a retention edge of the constraint bracket extending substantially perpendicularly from the wall after assembly of the tray to the translating bracket to retain assembly of the tray to the translating bracket.

10. The tray of claim 9, further comprising a plunger lock coupled to the housing and configured to engage with a plunger lock hole of the chassis wall in order to retain the tray in a position relative to the translating bracket.

11. The tray of claim 9, further comprising a retention feature formed on a bottom surface of the housing and extending substantially perpendicular from the housing and configured to be mechanically engage with a retaining feature of the chassis.

* * * * *